United States Patent [19]
Hase et al.

[11] Patent Number: 5,766,502
[45] Date of Patent: Jun. 16, 1998

[54] PIEZOELECTRIC CERAMICS AND MANUFACTURING METHOD THEREOF

[75] Inventors: Kiyoshi Hase, Ishikawa-ken; Hiroshi Takagi, Ohtsu; Akira Ando, Ohmihachiman; Akira Nagai, Tsuzuki-gun; Yu Tokuda, Muko; Koichi Hayashi, Shiga-ken, all of Japan

[73] Assignee: Murata Manufacturing Co., Ltd., Kyoto, Japan

[21] Appl. No.: 729,733

[22] Filed: Oct. 7, 1996

[30] Foreign Application Priority Data

Oct. 6, 1995 [JP] Japan ................... 7-260228

[51] Int. Cl.$^6$ ............ C04B 35/491; C04B 35/493; C04B 35/49
[52] U.S. Cl. .................. 252/62.9 PZ; 501/134
[58] Field of Search ............ 252/62.9 PZ; 501/134

[56] References Cited

FOREIGN PATENT DOCUMENTS 0575966   6/1993   European Pat. Off. .

OTHER PUBLICATIONS

Derwent Publication Ltd., London, GB, 95–110426, "Piezoelectric Ceramic Piezoelectric Device Ceramic Oscillator Comprise Lead Zironate Titanate Contain Manganese". Jul. 19, 1993.

Derwent Publication Ltd., London, GB, 94–329814, "Produce Piezoelectric Ceramic Manufacture Ceramic Vibration Ceramic Filter Substitute Lead Antimony Tin Zirconium Composite Oxide Calcium Add Chromium Oxide Thermal Diffusion Manganese". Feb. 16, 1993.

Derwent Publications Ltd., London, GB, 94–071738, "Piezoelectric Ceramic Composition Actuate Comprise Perovskite Oxide Lead Zirconium Zinc Niobium Oxygen Substitute Calcium Barium Strontium Lead Site". Sep. 10, 1991.

Derwent Publication Ltd., London, GB, 93–239844, "Piezoelectric Ceramic Manufacture Actuate Contain Lead Zirconium Titanium Complex Oxide Add Iron Aluminium Manganese". May 7, 1992.

*Primary Examiner*—Melissa Bonner
*Attorney, Agent, or Firm*—Ostrolenk, Faber, Gerb & Soffen, LLP

[57] ABSTRACT

Piezoelectric ceramics whose mechanical quality factor Qm is small and which has an excellent heat resistance, e.g. piezoelectric ceramics for filtering elements whose group delay time characteristic is flat, phase distortion is small and which can be accommodated to surface mounting, and a method for stably producing it are provided. Manganese oxide and lead oxide are caused to coexist in high concentration in grain boundary parts of the piezoelectric ceramics containing composite oxides of at least lead, zirconium and titanium as compared to intra-crystal grains of the piezoelectric ceramics. It is manufactured by treating the piezoelectric ceramics by heat after adhering manganese and lead compounds on the surface thereof to diffuse the oxides in the grain boundary parts of the piezoelectric ceramics.

17 Claims, 2 Drawing Sheets

—○— COMPARATIVE EXAMPLE

······□······ INVENTION

PIEZOELECTRIC CERAMICS AND MANUFACTURING METHOD THEREOF

FIELD OF THE INVENTION

The present invention relates to piezoelectric ceramics used for surface mounting type piezoelectric parts which are specially required to be heat resistant and to a manufacturing method therefor.

BACKGROUND OF THE INVENTION

As piezoelectric ceramics used for ceramic filters and the like, piezoelectric ceramics mainly composed of lead titanate zirconate (e.g. $Pb(Ti_xZr_{1-x})O_3$ or PZT) and the like have been widely used.

A material for a ceramic filter having such excellent characteristics that its group delay time (GDT) characteristic is flat and its phase distortion is small requires that the value of its mechanical quality factor Qm be small. Various micro-additives have been added in order to try to improve the piezoelectric characteristics thereof. Previously known materials included one in which niobium oxide, antimony oxide, tantalum oxide or the like was used as an additive to lead titanate zirconate and one in which part of Pb atoms of lead titanate zirconate were replaced with rare earth elements.

However, the piezoelectric ceramics whose Qm value is small as described above have had the disadvantage even if their Curie temperature is high, the electromechanical coupling factor K drops and resonance and anti-resonance frequencies shift significantly when a gap between electrodes formed on the both edges of the piezoelectric ceramics is opened with an increase of temperature, although it is fine when the electrodes are shorted. Therefore, they present a problem when used as a surface mounting type filtering element in that their filtering characteristic degrades significantly when it is exposed to a temperature about 250° C. at the time of reflow soldering.

It has been reported that the resistivity of grain boundary parts may be lowered and the heat resistance be enhanced to solve the above-mentioned problem by thermally diffusing a manganese compound from the surface of piezoelectric ceramics whose Qm value is small and Curie temperature is high to maldistribute manganese oxide in grain boundary layers. See, for instance, Japanese Patent Laid Open Nos. Hei. 6-1655 through 1657.

However, there is a problem from the aspect of manufacturing when the manganese compound is thermally diffused from the surface of the piezoelectric ceramics in that characteristics vary widely when the temperature within the thermodiffusion furnace is widely distributed or when the quantity of Pb within the PZT system piezoelectric ceramics fluctuates based on the specifics of the manufacturing process due to evaporation and the like. Further, the drop of the resistivity of the grain boundary parts and the enhancement of the heat resistance have been insufficient.

Accordingly, it is an object of the present invention to solve the aforementioned problems by providing piezoelectric ceramics whose mechanical quality factor Qm is small and which has an excellent heat resistance, e.g. piezoelectric ceramics for filtering elements whose group delay time characteristic is flat and phase distortion is small and which can be accommodated to surface mounting, and a method for stably manufacturing it.

SUMMARY OF THE INVENTION

The piezoelectric ceramics of the present invention are characterized in that manganese oxide and lead oxide coexist in high concentration in grain boundary parts of the piezoelectric ceramics containing composite oxides of at least lead, zirconium and titanium as compared to intra-crystal grains of the piezoelectric ceramics.

A manufacturing method for the piezoelectric ceramics according to the present invention is characterized in that the piezoelectric ceramics containing composite oxides of at least lead, zirconium and titanium is treated by heat after adhering manganese and lead compounds on the surface thereof to diffuse the metal oxides in grain boundary parts of the piezoelectric ceramics.

The resistivity of the piezoelectric ceramics may be lowered and its heat resistance be enhanced by causing manganese oxide and lead oxide to coexist in high concentration in the grain boundary parts of the piezoelectric ceramics as compared to the intra-crystal grains of the piezoelectric ceramics.

Further, when the piezoelectric ceramic is treated by heat after adhering the manganese and lead compounds on the surface thereof in the inventive manufacturing method, the lead compound melts on the surface of the piezoelectric ceramic at the diffusion temperature (e.g. melting point of lead oxide is 890° C.). Thereby, the manganese compound migrates readily to the grain boundary parts of the piezoelectric ceramics so that it may be diffused homogeneously over a wide temperature range. Further, even if there is a lower quantity of Pb in the grain boundary parts of the piezoelectric ceramics, the diffusion of the manganese compound to the grain boundary is still promoted by the lead compound melting on the surface.

The above and other advantages of the present invention will become more apparent in the following description and the accompanying drawings.

DETAILED DESCRIPTION OF THE EMBODIMENTS OF THE INVENTION

The present invention will be explained more concretely by showing an embodiment thereof.

At first, powders of PbO, $SrCO_3$, $La_2O_3$, $TiO_2$ and $ZrO_2$, which are components of piezoelectric ceramics whose mechanical quality factor Qm is small, were prepared as starting materials. Then, each powder was weighed so that a ceramic having a composition of $(Pb_{0.95}Sr_{0.03}La_{0.02})(Zr_{0.51}Ti_{0.49})O_3$ can be obtained and water was added. The combination was wet mixed using a ball mill. The mixture thus obtained was dried and then calcined for two hours at 800° to 900° C. The calcined material was crushed in the wet by using a ball mill to obtain a prepared powder.

The prepared powder was sintered for two hours at a temperature from 1150° to 1250° C. after adding water or a caking agent such as polyvinyl alcohol and press molded obtain rectangular plate-like ceramics of 20×30 mm and 0.75 mm in thickness.

Meanwhile, $MnCO_3$ powder was kneaded together with PbO powder in a varnish to prepare a paste.

Next, the paste thus prepared was applied on the surface of the ceramics by means of screen printing, dried and then treated by heat for two hours at a temperature of about 850° to 1100° C. to diffuse the manganese compound. After that, the ceramics were polished to 0.5 mm thickness and silver electrodes were applied and baked on both edge faces thereof. Then, a polarizing processing was implemented for 30 minutes within an insulating oil (temperature: room temperature to 100° C.) and in an electric field of 2 to 3 kV/mm to obtain piezoelectric ceramics.

A sample of piezoelectric ceramics having the same shape as the sample prepared by $MnCO_3$ powder, PbO powder and varnish was prepared for testing. As a comparative example, a sample where a paste with only by $MnCO_3$ powder in the varnish, without PbO powder, is applied on the surface of the piezoelectric ceramics was made.

These samples were cut into square plates of 5×5 mm, respectively, and their specific resistance ρ and the electromechanical coupling factor K in spreading oscillation were measured.

Figure 1:
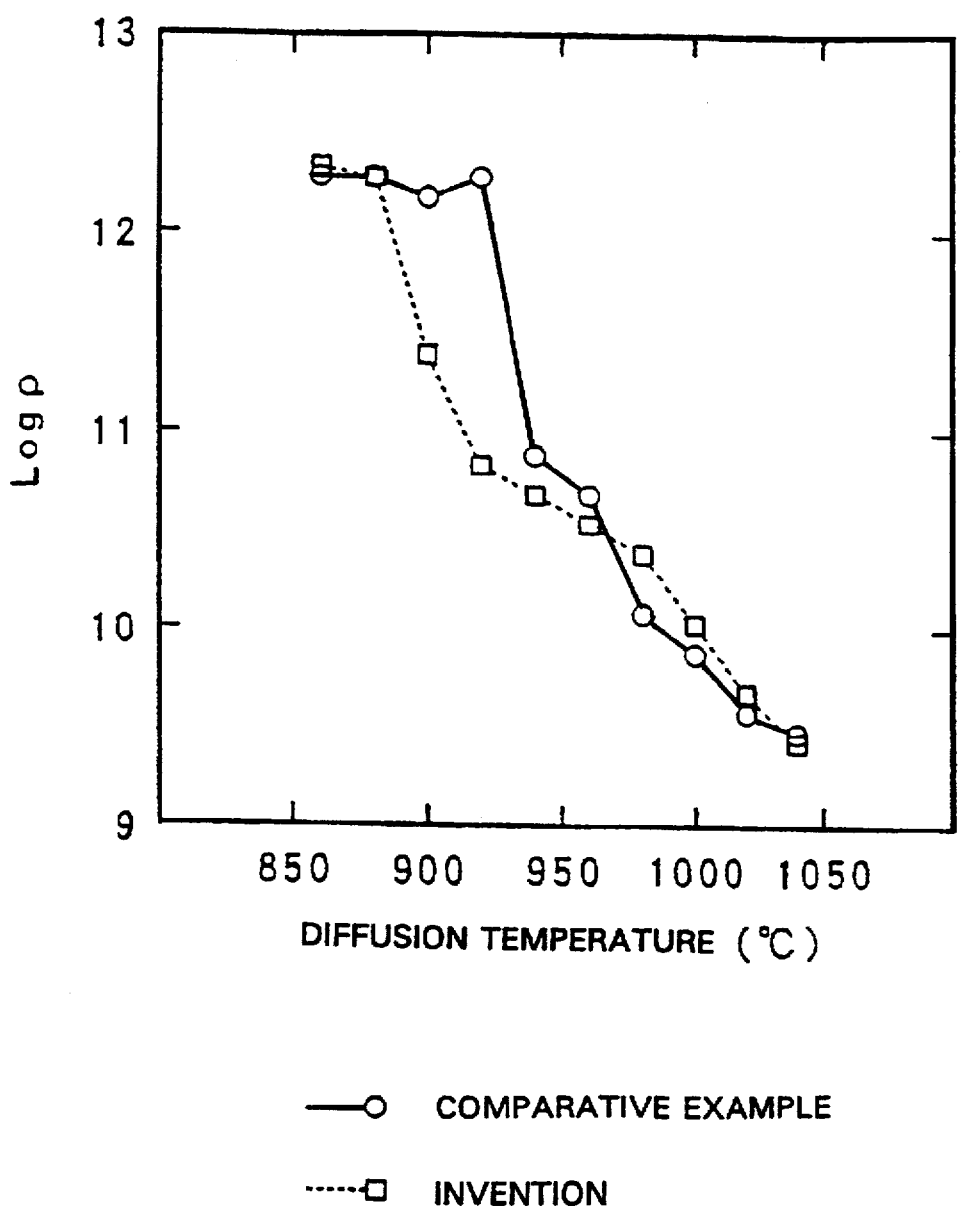
FIG. 1 is a graph showing changes of specific resistance ρ with respect to diffusion temperature.
Figure 2:
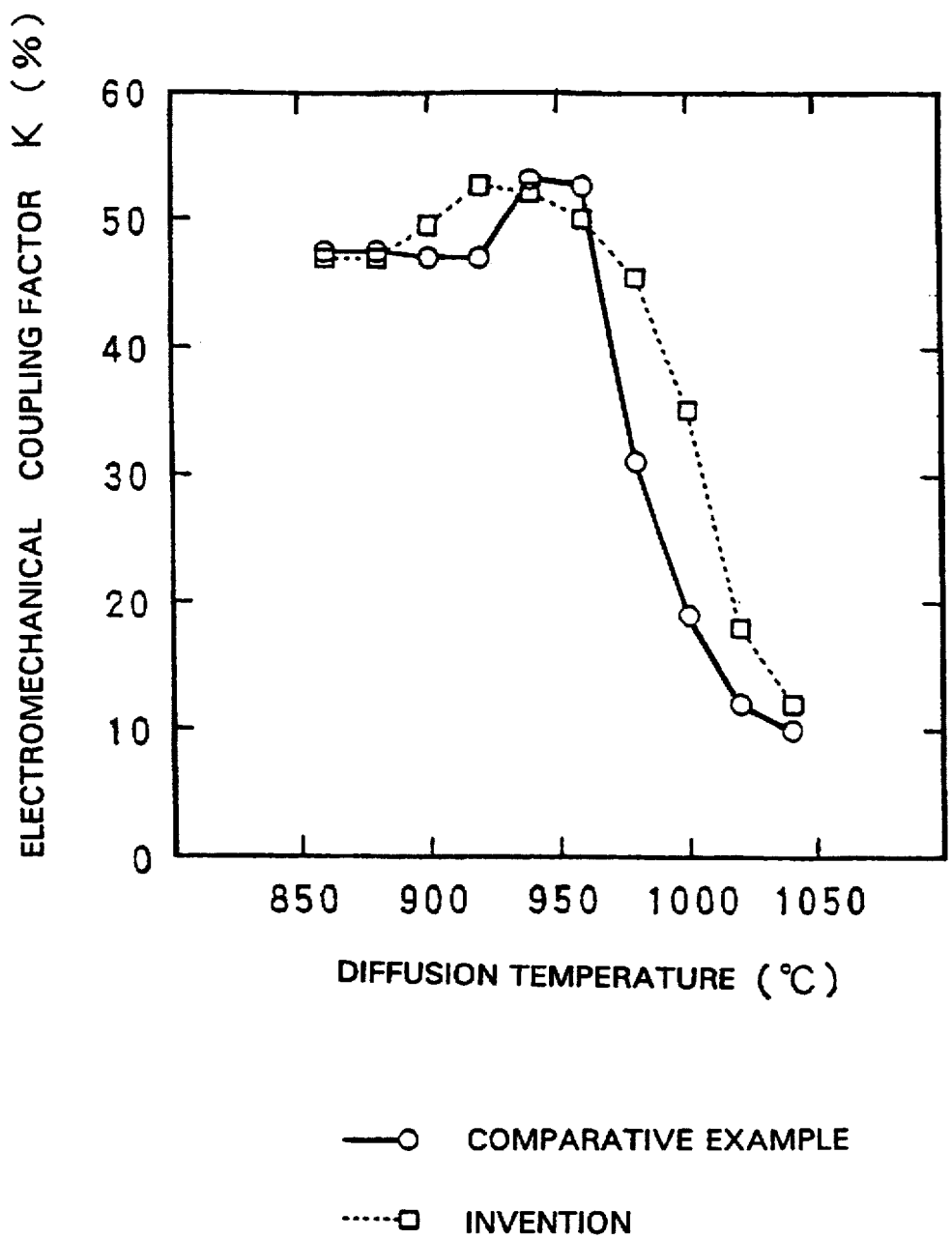
FIG. 2 is a graph showing changes of electromechanical coupling factor K with respect to the diffusion temperature.

Prepared from the measuring results, FIG. 1 shows changes of the specific resistance ρ with respect to the diffusion temperature and FIG. 2 shows changes of the electromechanical coupling factor K with respect to the diffusion temperature, respectively.

It can be seen from FIG. 1 that ρ is dropping more at the lower temperature side of the diffusion temperature in the case of the embodiment in which the paste containing the manganese and lead compounds was used as compared to the case of the comparative example in which the paste containing only the manganese compound, without lead compound, was used.

Further, it can be seen from FIG. 2 that the electromechanical coupling factor K is large within the most of the range of the diffusion temperature in the case of the embodiment in which the paste containing the manganese and lead compounds was used as compared to the case of the comparative example in which the paste containing only the manganese compound, without lead compound, was used.

Thus, according to the present invention, piezoelectric ceramics in which manganese oxide and lead oxide coexist in high concentration in the grain boundary parts of the piezoelectric ceramics containing composite oxides of at least lead, zirconium and titanium as compared to the intra-crystal grains of the piezoelectric ceramics can be fabricated by treating the piezoelectric ceramics by heat after adhering manganese and lead compounds on the surface thereof to diffuse the metals in the grain boundary parts of the piezoelectric ceramics. Accordingly, characteristics of the piezoelectric material where the specific resistance ρ is low and the electromechanical coupling factor K is large within the diffusion temperature range can be obtained.

It is noted that although the method of applying the paste on the surface of the ceramics by means of screen printing has been used to adhere it on the surface in the embodiment described above, the present invention is not confined only to that method and other adhesion methods such as brush coating, spray coating or the like may be used.

Further, while the piezoelectric ceramic having the composition of $(Pb_{0.95}Sr_{0.03}La_{0.02})(Zr_{0.51}Ti_{0.49})O_3$ has been used in the embodiment described above, the present invention is not confined only to that and it may be PZT ceramic system having other compositions such as those in which part of lead, i.e. the main material thereof, is replaced with Sr, Ba, Ca, La or the like, for example.

In the above embodiment, manganese carbonate and lead oxide were used but the invention is not restricted to these compounds. Other Mn or Pb compounds, or various combinations thereof, which form the oxides on heating can be used. The heating temperature is generally about 900°–1100° C. but the invention is not limited to this range. Preferably, heating is carried out at about 920° to 1000° C. The manganese compound and varnish used heretofor can be employed in this invention by adding a suitable lead compound thereto. The amount of manganese compound or manganese oxide present, calculated as manganese dioxide, is generally about 0.005 to 0.5 wt % based on the weight of the ceramic and preferably about 0.005 to 0.3 wt %. The amount of the lead compound or lead oxide present is generally equal to or lower than about 5 mol % based on the weight of the ceramic and preferably about 3 mol %. The manner in which the manganese and lead compounds are adhered to the surface of the piezoelectric ceramic is also not restricted.

As described above, the present invention allows the resistivity of the piezoelectric ceramics to be lowered and the heat resistance to be enhanced and allows the manganese compound to be diffused stably when it is thermally diffused within the PZT piezoelectric ceramics regardless of the dispersion of temperature in the diffusion furnace or of the fluctuation of the quantity of Pb.

Accordingly, because the mechanical quality factor Qm is small and the resistance is low, piezoelectric ceramics having excellent heat resistance, e.g. piezoelectric ceramics for filtering elements whose group delay time characteristic is flat and phase distortion is small and which can be accommodated to surface mounting, can be obtained and can be produced stably.

While a preferred embodiment has been described, variations thereto will occur to those skilled in the art within the scope of the present inventive concepts which are delineated by the following claims.

What is claimed is:

1. Piezoelectric ceramic comprising a composite oxide of at least lead, zirconium and titanium and having manganese and lead oxides in grain boundary parts of said piezoelectric ceramic at a higher concentration compared to intra-crystal grains of said piezoelectric ceramic.

2. A piezoelectric ceramic according to claim 1 in which the ceramic is PZT.

3. A piezoelectric ceramic according to claim 1 in which the amount of manganese oxide is about 0.005 to 0.5 wt % calculated as $MnO_2$ and based on the weight of said composite oxide.

4. A piezoelectric ceramic according to claim 2 in which the amount of mangaese oxide is about 0.005 to 0.5 wt % calculated as $MnO_2$ and based on the weight of said composite oxide.

5. A piezoelectric ceramic according to claim 4 in which the amount of lead is equal to or lower than about 5 mol %.

6. A piezoelectric ceramic according to claim 3 in which the amount of lead is equal to or lower than about 5 mol %.

7. A piezoelectric ceramic according to claim 1 in which the amount of lead is equal to or lower than about 5 mol %.

8. A piezoelectric ceramic according to claim 7 in which the amount of manganese oxide is about 0.005 to 0.5 wt % calculated as $MnO_2$ based on the weight of said composite oxide.

9. A manufacturing method for piezoelectric ceramic comprising heating a piezoelectric ceramic comprising a composite oxide of at least lead, zirconium and titanium having adhered manganese and lead compounds on a surface thereof at a temperature sufficient to diffuse said manganese and lead oxides to grain boundary parts of said piezoelectric ceramic.

10. A manufacturing method for piezoelectric ceramic according to claim 9, wherein said composite oxide is represented by the formula $(Pb_{0.95}Sr_{0.03}La_{0.02})(Zr_{0.51}Ti_{0.49})O_3$.

11. A manufacturing method for piezoelectric ceramic according to claim 9, wherein said manganese compound adhered to the surface is $MnCO_3$.

12. A manufacturing method for piezoelectric ceramic according to claim 9, wherein said composite oxide is heated at about 850° C. to 1100° C.

13. A manufacturing method for piezoelectric ceramic according to claim 12, wherein said composite oxide is treated by heat for about 2 hours.

14. A manufacturing method for piezoelectric ceramic according to claim 9 in which the amount magnesium compound adhered is about 0.005 to 0.5 wt % calculated as $MnO_2$ and the amount of lead adhered is equal or lower than about 5 mol %.

15. A manufacturing method for piezoelectric ceramic according to claim 14, wherein said composite oxide is heated at about 850° C. to 1100° C.

16. A manufacturing method for piezoelectric ceramic according to claim 15, wherein said manganese compound adhered to the surface is $MnCO_3$.

17. A manufacturing method for piezoelectric ceramic according to claim 16, wherein said composite oxide is represented by the formula $(Pb_{0.95}Sr_{0.03}La_{0.02})(Zr_{0.51}Ti_{0.49})O_3$.

* * * * *